United States Patent [19]
Kaegebein

[11] Patent Number: 5,418,490
[45] Date of Patent: May 23, 1995

[54] FAILURE RESPONSIVE ALTERNATE AMPLIFIER AND BYPASS SYSTEM FOR COMMUNICATIONS AMPLIFIER

[75] Inventor: Daniel P. Kaegebein, Depew, N.Y.

[73] Assignee: TX RX Systems, Inc., Angola, N.Y.

[21] Appl. No.: 200,271

[22] Filed: Mar. 1, 1994

[51] Int. Cl.⁶ .............................................. H03F 3/68
[52] U.S. Cl. .................... 330/124 D; 330/51
[58] Field of Search ............... 330/124 D, 124 R, 295, 330/51

[56] References Cited

U.S. PATENT DOCUMENTS

| | | | |
|---|---|---|---|
| 1,396,745 | 11/1921 | Haddock | 330/151 |
| 1,472,455 | 10/1923 | Blattner | 381/58 |
| 1,525,054 | 2/1925 | Toomey | 381/58 |
| 2,229,108 | 1/1941 | Maggio et al. | 178/44 |
| 2,647,176 | 7/1953 | Daly | 179/171 |
| 2,773,944 | 12/1956 | Karlson | 179/171 |
| 3,204,062 | 8/1965 | Foster et al. | 200/105 |
| 4,494,077 | 1/1985 | Fukaya et al. | 330/295 |
| 4,565,972 | 1/1986 | Kaegebein | 330/124 D |

FOREIGN PATENT DOCUMENTS 9119348 12/1991 WIPO ............................. 330/124 D

OTHER PUBLICATIONS

TX RX Systems Inc., 800 MHz Tower Mounted Receiver Multicoupler Model 421-86-01-(XX), System Design, no date.
Decibel Products, QUADRA ™ The Fail-Safe Tower Top Amp System, 1992.

Primary Examiner—Steven Mottola
Attorney, Agent, or Firm—Bean, Kauffman & Spencer

[57] ABSTRACT

A communications amplifier system which includes a primary preamplifier circuit, a secondary preamplifier circuit and a bypass circuit mutually exclusively selectable through a relay switching means which is automatically activated to bypass the primary preamplifier with the secondary preamplifier or the secondary preamplifier with the bypass circuit in the event of malfunction. In the standby mode, the secondary preamplifier is not connected to DC power or RF signal input.

20 Claims, 5 Drawing Sheets

FAILURE RESPONSIVE ALTERNATE AMPLIFIER AND BYPASS SYSTEM FOR COMMUNICATIONS AMPLIFIER

This invention relates to amplifier systems which include failure responsive automatic switching means for a backup amplifier circuit and a backup amplifier bypass circuit.

BACKGROUND OF THE INVENTION

Communications systems require radio frequency amplification for increasing system sensitivity when receiving low level signals from an antenna located at the top of a radio tower.

A tower mounted preamplifier located at the base of an antenna may offer up to a ten DB improvement in receiver sensitivity over preamplifier systems located at the base of the tower in that the former preserves the signal-to-noise ratio existing at the base of the antenna by amplifying signals before they are reduced in amplitude by tower-to-ground transmission line losses. Unfortunately tower mounted preamplifiers are not readily accessible for maintenance in case of system failure. Therefore it has been a practice to provide systems which permit the tower mounted preamplifiers to be bypassed and signals carried by the transmission line to a backup or secondary preamplifier located at ground level. When the system is switched to the backup preamplifier, which is not located on top of the tower, the improvement in system sensitivity achieved by using a tower mounted preamplifier is lost.

Radio frequency amplifiers may be used in two-way repeater amplifiers, i.e. bidirectional amplifiers, or one-way amplifiers. In critical system applications where amplifier failure caused down time is a major concern, a backup circuit is usually incorporated in the system.

The use of an alternate amplifier circuit to be used in the event of a primary circuit failure is well known but all of the existing systems fail to provide a backup system suitable for a tower mounted application with remote control. For instance, J. Maggio et al, U.S. Pat. No. 2,229,108 on "Switching Of Spare Repeater Sections" issued Jan. 21, 1941 discloses the broad concept of a spare amplifier circuit in combination with a plurality of amplifier circuits. The system requires an intricate array of relays to provide a single spare circuit for a three circuit system and the extensive hardware required to provide the switching increases the probability of failure to a point which far exceeds any benefits which may be derived in overall reliability from inclusion of the spare circuit. An even more serious shortcoming of the Maggio et al system is the fact that the multi-pole, multi-throw relays incorporated in the system are satisfactory for high frequency operation but completely unsatisfactory for use with preamplifiers where RF frequencies are encountered.

Other examples of backup amplifier circuits may be found in Haddock, U.S. Pat. No. 1,396,745; Blattner, U.S. Pat. No. 1,472,455; Toomy, U.S. Pat. No. 1,525,054; Daly, U.S. Pat. No. 2,647,176; and Karlson, U.S. Pat. No. 2,773,944. None of the techniques utilized by these references lends itself to the use in a remote tower or to preamplifier systems operating in the RF range.

In the forgoing systems, the "standby" method has an advantage over the "common redundant preamplifier" method. The redundant method connects two preamplifiers in parallel with input and output 3 db hybrids. The theory behind this is that if one amplifier fails, the second amplifier will maintain system operation, although at a reduced performance level due to an increase in noise and reduction in gain. Another drawback of the redundant method is that both preamplifiers are active in the system and both are vulnerable to damage by lightning.

Many of the above problems are eliminated by the teachings of U.S. Pat. No. 4,565,972 for a "Tower Mounted Preamplifier", a preamplifier backup system which is located in the tower but activated at ground level by interrupting the DC voltage to the tower mounted preamplifier assembly for a short time duration. This operates a latching relay which switches DC power and RF signals alternately between either of two identical preamplifiers each time the power is interrupted. This is usually done manually at the site after poor signal reception has been experienced, although the switching could be done remotely via a modem and telephone line or other radio link to the modem.

Following the teachings of U.S. Pat. No. 4,565,972 requires an action to be taken by an individual to place the standby or secondary amplifier in operation.

OBJECTIVES OF THE INVENTION

In view of the obvious inability of prior art amplifier systems incorporating backup circuits to function satisfactorily in remote RF environments without human intervention, it is a primary objective of the present invention to provide an automatically controlled alternate preamplifier circuit for a primary preamplifier circuit capable of functioning in the RF range.

A further objective of the present invention is to provide an automatically controlled complete bypass circuit for a primary preamplifier circuit and its associated, backup preamplifier circuit.

Another objective is to provide a means for monitoring preamplifier operation which will automatically switch to a secondary preamplifier when the monitored circuit functions fall out of preset limits.

A further objective is to provide a standby preamplifier circuit which is switched out of the circuit in both the DC power and RF signal inputs to eliminate exposure to lightning damage.

A still further objective of the present invention is to provide a tower mounted preamplifier system including a spare, backup preamplifier circuit and a preamplifier bypass circuit, both automatically controllable in response to the output of a voltage comparator circuit.

A further objective of the present invention is to provide a tower mounted preamplifier system including a backup preamplifier circuit and bypass circuit powered by a DC potential derived from an alternating current source. A battery backup power supply is coupled to the preamplifier system via the alarm/control cable which connects to the base control panel.

SUMMARY OF THE INVENTION

This patent discloses a remote preamplifier system which includes a primary preamplifier circuit, a backup preamplifier circuit which may be placed in service to bypass the primary preamplifier circuit and a bypass circuit for circumventing both preamplifiers if they become inoperative. Circuit switching is achieved through an automatic system which determines the need to switch between the available circuits by monitoring the current draw of the preamplifier stages. The system utilizes four single-pole, double-throw RF coaxial relays to provide circuit routing through the primary preamplifier, the backup preamplifier or the bypass circuit. The RF coaxial relays are controlled by a logical series connected DC comparator responsive to the primary preamplifier and a DC comparator responsive to the backup preamplifier.

DESCRIPTION OF THE INVENTION

Figure 1:
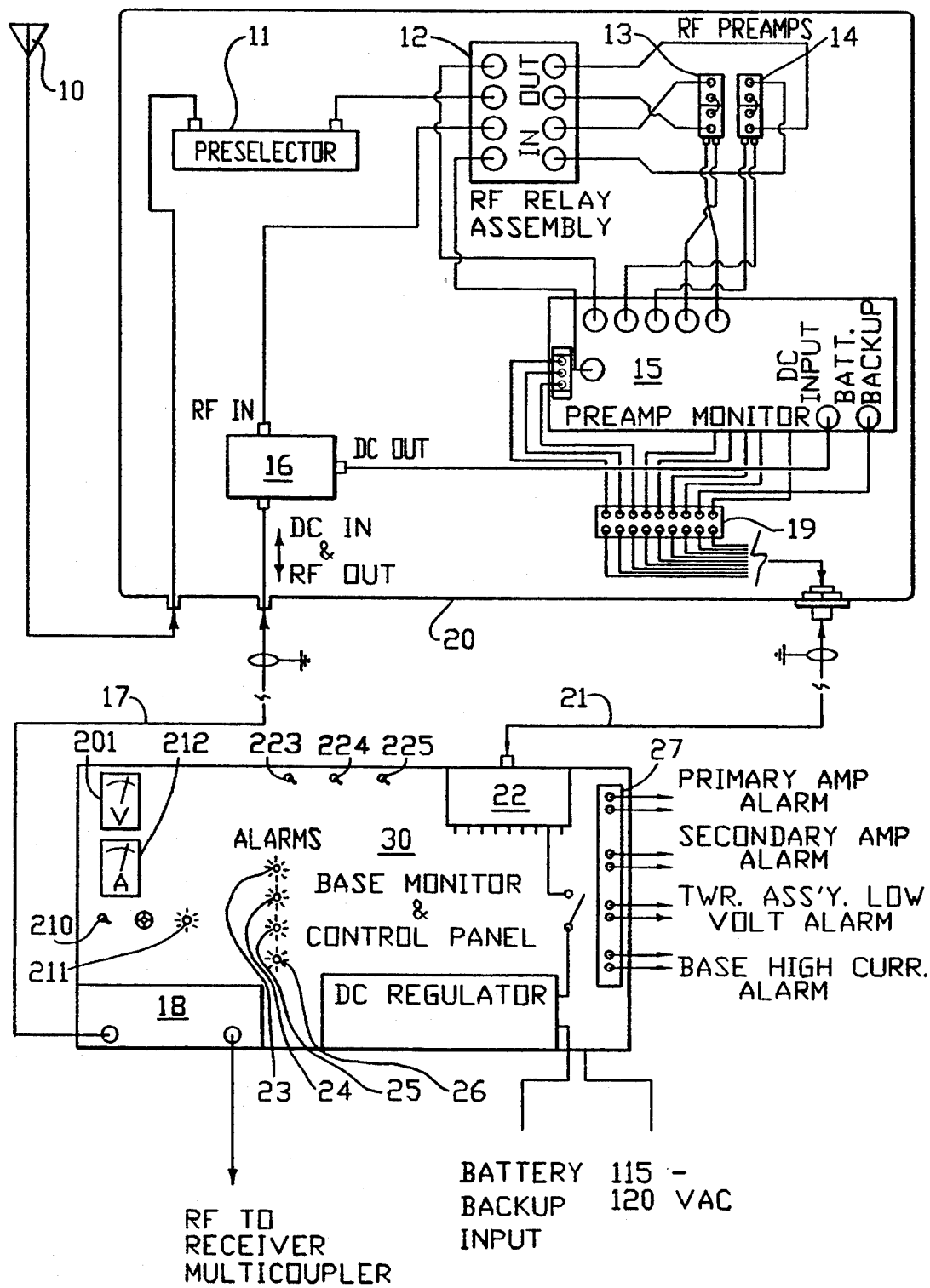
FIG. 1 is a functional block diagram of the tower mounted preamplifier system including the base monitoring component.

The preferred embodiment of the preamplifier system of the subject invention is a tower mounted system as illustrated in FIG. 1. It is comprised of a tower mounted system enclosed in a stainless steel, water tight housing 20 and a base monitor and control panel 30 located at the base of the tower. The antenna 10 is coupled via a preselector 11 to the RF relay assembly 12 which includes four single-pole double-throw RF co-axial relays which are controlled to switch the primary preamplifier 13 and backup preamplifier 14 in and out of the signal channel in a mutually exclusive manner. The relays are energized by outputs from a dual preamplifier monitor assembly 15 which compares functions of the input amplifiers and output amplifiers of the primary preamplifier 13 and backup preamplifier 14. The tower mounted system is considered the best mode of the invention but it is not limited thereto and may be used in any environment to eliminate the need for human intervention.

Figure 2:
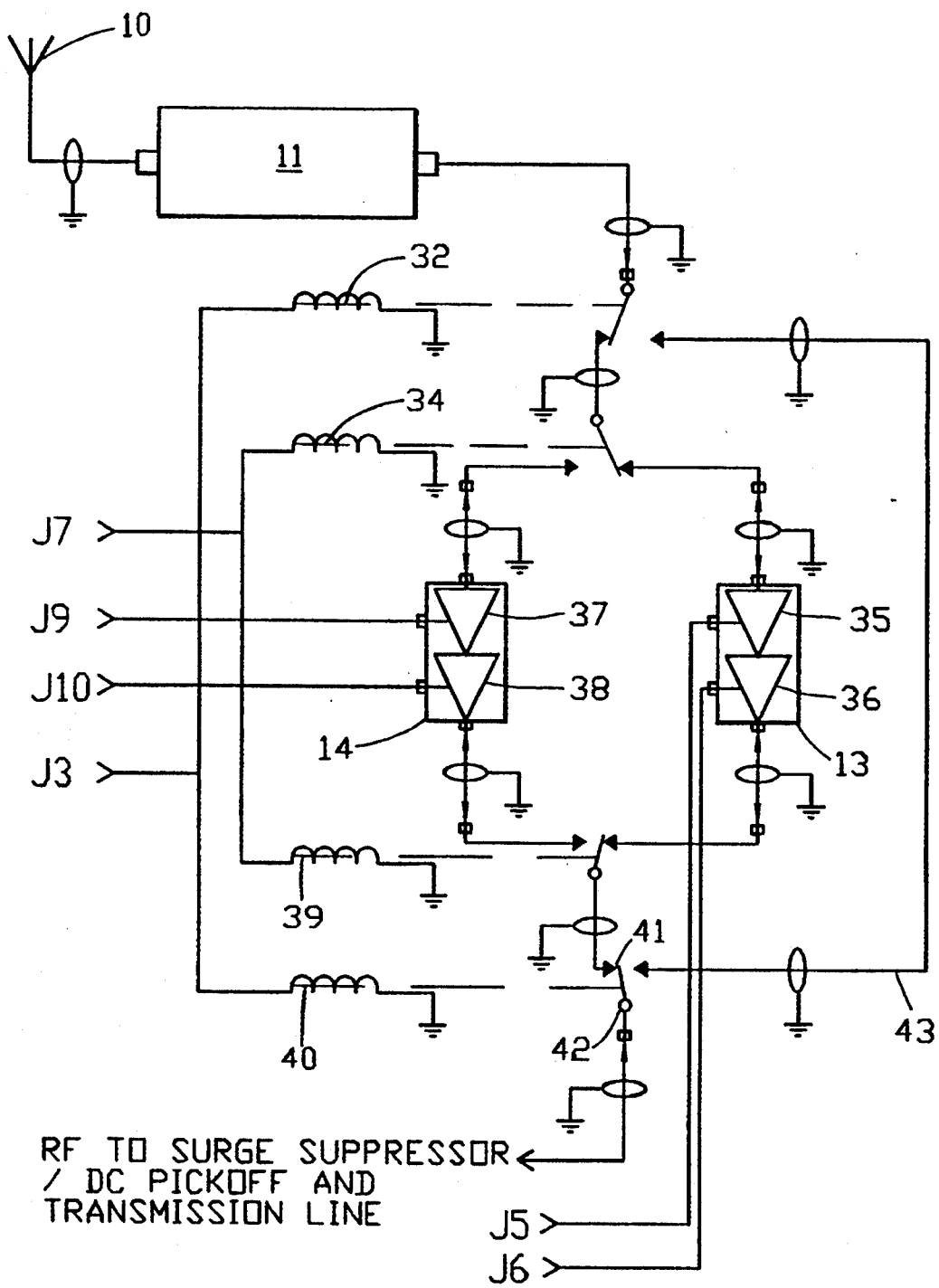
FIG. 2 is a schematic diagram of the interconnection and selection circuitry of the primary preamplifier, backup preamplifier and by-pass circuits.

The RF relay assembly 12 provides an RF signal output mutually and exclusively from either the primary preamplifier 13, backup preamplifier 14 or preamplifier bypass circuit illustrated in FIG. 2. This signal passes through a polyphaser, surge suppressor and DC pick-off circuit 16 of FIG. 1 and then through the tower transmission line 17 to the base monitor and control panel 30.

The base monitor and control panel includes an RF surge suppressor and DC injector 18. This circuit couples the RF signal to a receiver multicoupler and injects 15 volts DC onto the tower transmission line 17 to provide power to the tower mounted circuits via the DC pick-off section of circuit assembly 16.

A polyphaser surge suppressor 19 connects the dual preamplifier monitor 15 to the base monitor and control panel 30 via a 9-conductor alarm and control cable 21. This cable passes DC control and monitoring voltages through surge suppressor 22 to activate alarm 23 which indicates that the primary preamplifier if off line, alarm 24 which indicates that the backup preamplifier is off line, and alarm 25 which indicates low voltage in the tower assembly 20. Alarm 25 indicates high current on the tower transmission line 17 and is monitored by a circuit on the base control panel.

The base monitor and control panel 30 also includes a supervisory system terminal strip 27 which provides a means to connect the four signals that activate the panel alarm indicators 23 through 26 to remote alarm relays which use a floating ground completed via the terminal strip 27. A connection 29 for a backup battery power source to be used in the event of a power supply failure is located on the base monitor and control panel.

In the following description, the preferred embodiment incorporating relays is disclosed. However any one or all may be replaced by electronic circuits such as flip-flops.

Figure 3:
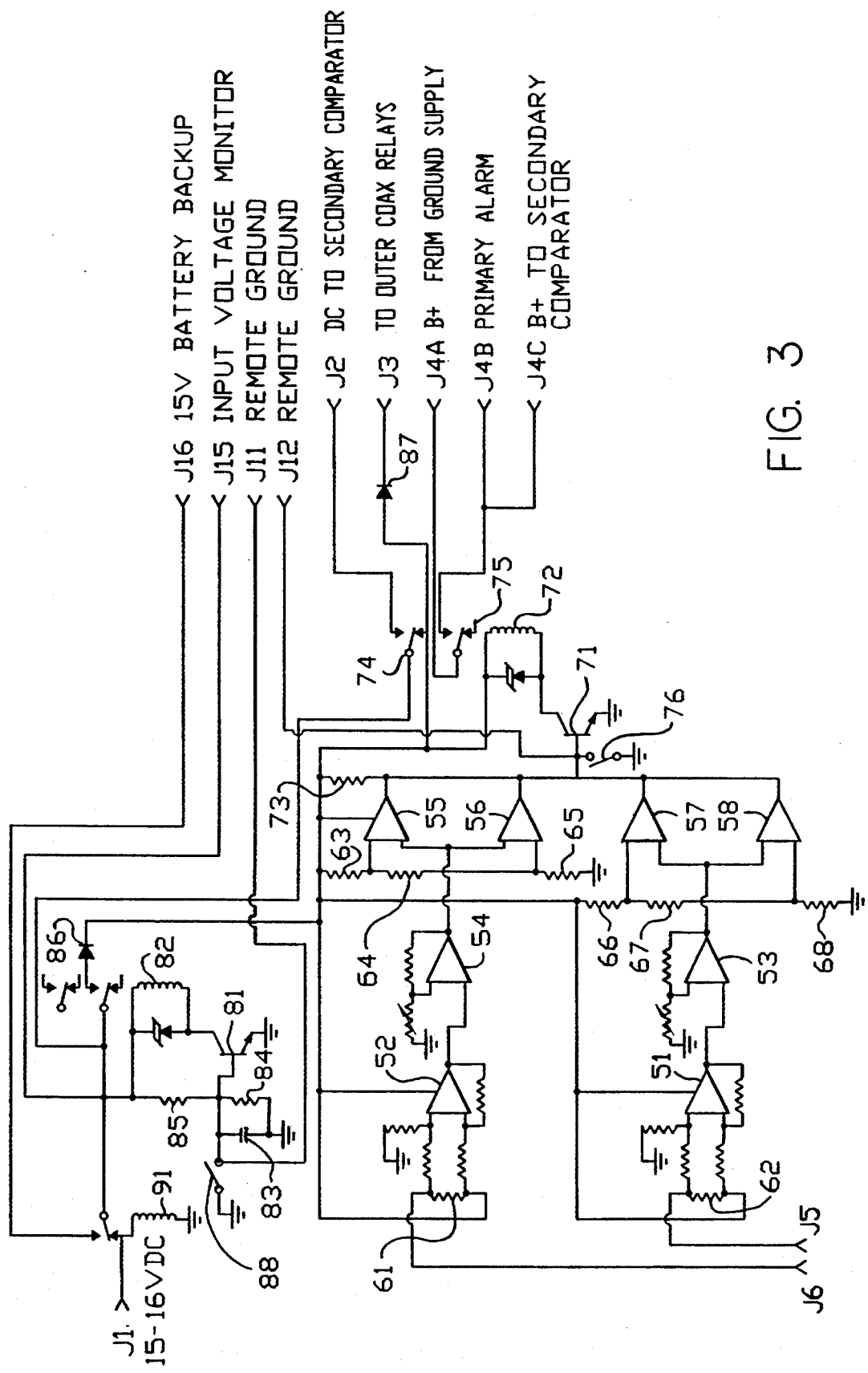
FIG. 3 is a schematic diagram of the DC comparator responsive to the primary preamplifier.
Figure 4:
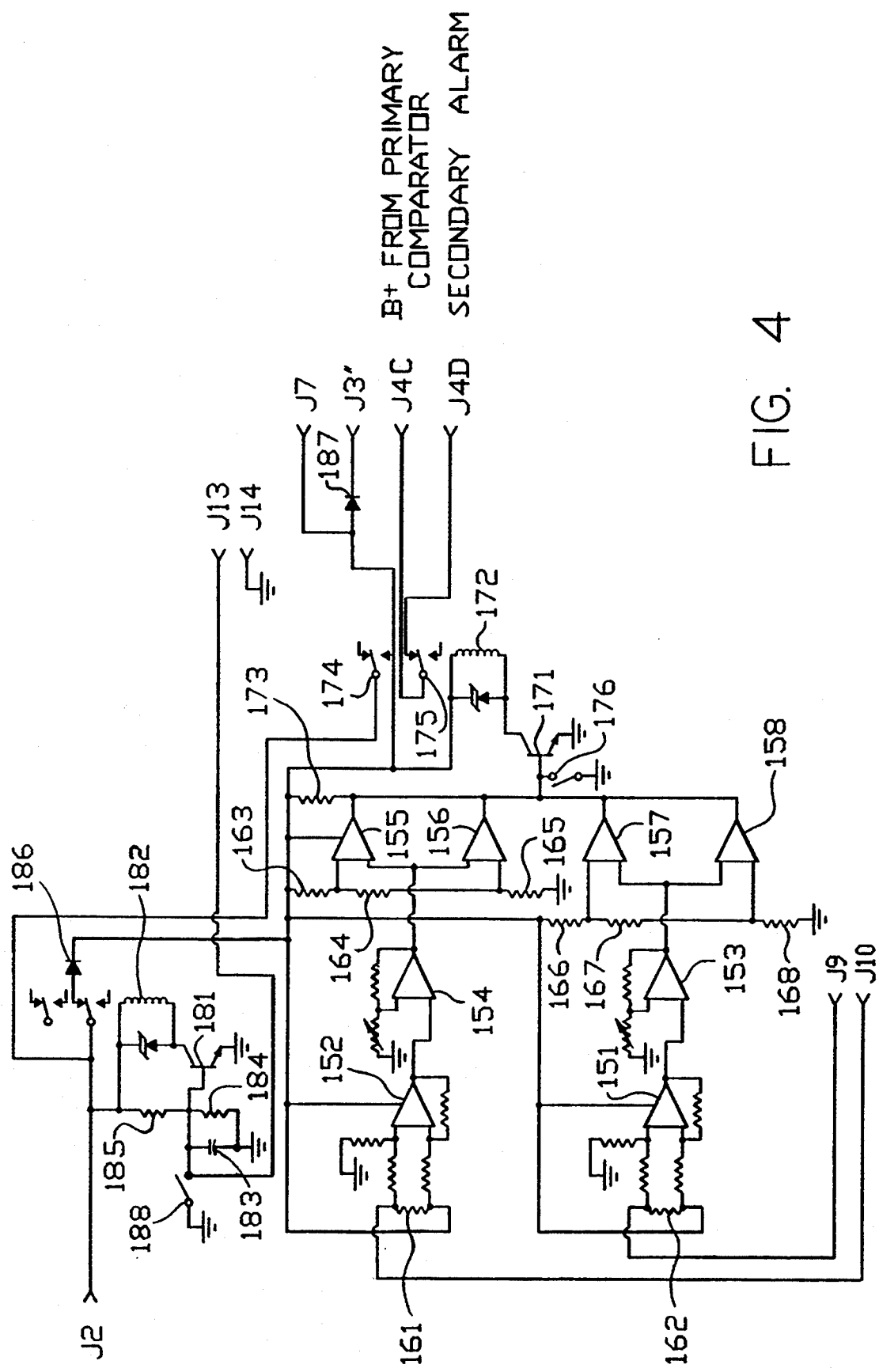
FIG. 4 is a schematic diagram of the DC comparator responsive to the backup preamplifier.

In FIG. 2, the signals received at the antenna 10 are applied through a bandpass preselector filter 11 to the pole contact of the single-pole, double-throw RF coaxial relay 32 which is energized through terminal J3 which is connected to terminals J3 of the primary and backup preamplifier DC comparator circuits illustrated in FIGS. 3 and 4 respectively. While relay 32 is energized, it connects the signal to the pole of the single-pole, double-throw RF coaxial relay 34 which is energized via J7 which is connected to J7 of the backup preamplifier DC comparator illustrated in FIG. 4. The normally closed contact of relay 34 connects the signal to the primary preamplifier 13 which is comprised of two or more series connected RF amplifier stages 35 and 36. When energized, relay 34 connects the signal to the backup preamplifier circuit 14 which also contains two or more series connected RF amplifiers 37 and 38.

RF coaxial relay 39 is a single-pole double-throw relay, the coil of which is in parallel with the coil of relay 34. The normally closed contacts of relay 39 couple the output of the primary preamplifier, 36, to contact 41 of relay 40. Relay 40 is an RF coaxial single-pole, double-throw relay, the coil of which is in parallel with the coil of relay 32. When energized, the normally open set of contacts of relay 39 connect the output of the backup preamplifier, 38, to contact 41 of relay 40 so that that contact is connected to the outputs of the primary and backup preamplifiers in a mutually exclusive manner. The pole contact 42 of relay 40 is connected to the transmission line to complete the signal path through the either of the preamplifiers when it is energized and its normally open contacts are closed.

When relays 32 and 40 are deenergized, their normally closed contacts form a signal path through bypass cable 43.

The current draw of the input amplifiers, 35 and 37, and output amplifiers, 36 and 38, of the primary and backup preamplifiers are monitored by their respective DC comparator circuits illustrated in FIGS. 3 and 4. The low noise stages or input amplifier stages are monitored via connector J5 for the primary preamplifier 35 and via connector J9 for the backup preamplifier. The high level signals of the preamplifiers are monitored via J6 for the primary preamplifier 36 and via J10 for the backup preamplifier 38. If the current draw of either the low noise or high level stage changes by a preset amount above or below the norm for the active preamplifier circuit, it is switched out of the circuit and replaced, the primary preamplifier by the backup preamplifier and the backup preamplifier by the bypass cable 43.

When the backup preamplifier is removed from the circuit and replaced by bypass cable 43, operation continues but without system gain, but evading added system loss due to a nonfunctional amplifier in the circuit.

The operational steps are sequential, i.e. the primary preamplifier 13 is active and monitored until a fault is detected by the DC comparator of FIG. 3, then the backup preamplifier 14 is activated in place of the primary and it continues until a fault is detected by the DC comparator of FIG. 4 after which it is deactivated and replaced by the bypass cable 43. If the DC power to the tower preamplifier assembly is interrupted, the system will reset, monitoring first the primary preamplifier. If it is operating within the preset current setting, it will remain in operation.

The ground referencing differential input circuits, 51 and 52 of FIG. 3, and DC gain stages, 53 and 54, are individual operational amplifier circuits which in the preferred embodiment are found on LM158AJ integrated circuits. The high level stage is a DC comparator formed by two amplifiers, 55 and 56, of a quad comparator LM139AJ. The other two amplifiers, 57 and 58, of the quad comparator function as the low noise stage comparator circuit. The basic circuits are well known designs. The novel functioning of this system is due to the circuit interconnection methodology, and the use of the time delay circuit and DC relays to control the DC power fed to the preamplifiers and the coaxial RF relays which select the primary preamplifier, backup preamplifier or preamplifier bypass cable, according to the output of the relevant DC voltage comparator circuit.

FIG. 3 illustrates the circuits which comprise the primary preamplifier control means. Resistors 61 and 62 are in series with the DC power to high level and low noise preamplifier stages, 36 and 35 of FIG. 2, respectively via J6 and J5. The value of these resistors is selected to provide a small voltage which is proportional to current draw of the stages of the primary preamplifier, 13, which in the preferred embodiment is 300 to 350 millivolts.

This voltage is amplified and passed to the respective DC comparator, 55 and 56 or 57 and 58, for either the high level or Low noise preamplifier stage. The DC gain stage, 54 or 53, is adjusted for a DC output of 10 volts to the appropriate comparator. If the normal sample voltage is 350 millivolts, this is a gain of 28.57.

A current draw variance in the sampled preamplifier stage of +/−18% indicates some fault in the amplifier, and the backup preamplifier 14 is be selected by the RF relay action described with respect to FIG. 2. If 10 volts is the norm to the comparator, a +/−18% change in current draw will translate to 11.8 volts high trip and 8.2 volts low trip. These trip points are set by proper selection of resistors 63, 64 and 65 on the high level comparator and 66, 67 and 68 on the low noise comparator.

An NPN transistor, 71, is used as a switch to control energizing relay 72. The transistor circuit is a grounded emitter configuration so the base voltage of the transistor must be positive relative to the emitter for collector current to flow from the grounded emitter to the collector and up through the coil of relay 72, energizing the relay. If the voltages at the inputs to the comparators, 55, 56, 57 or 58, are within the selected ranges, their high impedance outputs result in a positive voltage across resistor 73 which turns transistor 71 on. As long as the comparator outputs present a high Impedance to the base of transistor 71, a positive voltage from resistor 73 will turn on the transistor and current will flow from the grounded emitter to the base and up thru resistor 73. Current will also flow from emitter to collector, energizing relay 72.

As long as relay 72 remains energized, the positive DC voltage from relay 91 is supplied via contacts 74 to the primary operating voltage circuit. The primary operating voltage circuit supplies B+ voltage to the primary preamplifiers, the primary preamplifier comparator circuit and RF coaxial relays 32 and 40 which are energized via connector J3. The signal path is through the preamplifiers 13 or 14 as a function of the status of RF coaxial relays 34 and 39 of FIG. 2.

If any one of the comparators 55, 56, 57 or 58 switches to a low impedance, it will turn off transistor 72, and deenergize relay 72. This causes the normally closed contact set 74 of relay 72 to close, disconnecting the DC potential to the primary voltage comparator circuit and connecting the positive DC potential to the secondary or backup operating preamp voltage comparator circuit. The backup operating preamp voltage comparator circuit provides B+ voltage to the backup preamplifiers, the backup preamplifier comparator circuit illustrated in FIG. 4 via J2 and the RF coaxial relays 32 and 40, and 34 and 39 vis J3 and J7 respectively. If the backup preamplifier is operating properly, RF coaxial relays 32 and 40 will remain energized by the backup comparator circuitry and coaxial RF relays 34 and 39 will become energized to switch the backup preamplifier into the signal channel in place of the primary preamplifier.

Deenergizing relay 72 closes contact set 75 to supply B+ from the power supply source at the tower base to the primary alarm via J4A and J4B and to the backup alarm relay via J4C and J4D.

Closing switch 76 will turn off transistor 71 to disable the primary preamplifier as if one of the comparators switched to low impedance. This can also be accomplished by applying a remote ground to the transistor's base via J12.

Switching between preamplifiers or initializing the system can result in out-of-limit comparisons until the amplifiers stabilize. Therefore a delay circuit is required.

When the system is first activated and power applied to the tower box preamplifier assembly 20, the active preamplifier requires a short period of time to stabilize in current and for control relay 72 to energize and close its normally open contact sets which control the flow of DC power to the backup preamplifier as well as the primary preamplifier comparator, the primary preamplifier, and the RF coaxial relays.

DC power is received from the polyphaser surge suppressor 16 of FIG. 1 via connector J1 at the primary power distribution delay circuit input of FIG. 3 to provide a B+ source to power the operating voltage circuits of the system. The delay circuit is controlled by the delay transistor 81 which is turned on when capacitor 83 is charged and its base is positive (0.7 to 1.0 volts). The ratio of resistor 84 to resistors 84+85 is about 13 to 1 so the 15 volt input places 1.9 volts at the base of the delay transistor 81 when capacitor 83 is fully charged thru resistor 85. The delay thus set by the RC time constant of capacitor 83 and resistor 84 delays the energization of relay 82 which creates the settling time required by the preamplifier circuits by powering the primary operating voltage circuit until relay 72 energizes. If relay 72 does not energize before relay 82, the primary preamplifier will not come on line.

Before the delay transistor starts to conduct, power is applied through the normally closed contacts of the deenergized relay 82 to the primary preamplifier comparator circuitry and coil of relay 72. When relay 72 is allowed to energize by the in-tolerance operation of comparators 55 through 58, energization of relay 82 is no longer necessary because its contacts are bypassed by contact set 74 of relay 72. If the primary preamplifier comparators do not stabilize and turn transistor 71 on before the RC time constant of delay transistor 81 times out, the primary preamplifier will be considered defective and not allowed to be active.

Voltage to power the primary preamplifiers, comparator circuitry and RF coaxial relays 32 and 40 passes through the normally open contacts of relay 72 which are closed when it is energized. Since relay 72 is in a de-energized state when power is first applied, an alternate DC path must be provided around the relay to initially power up the primary comparators, preamplifiers, and RF coaxial relays 32 and 40. This is accomplished by relay 82 in its initial relaxed state, thru diode 86. Within milliseconds, relay 82 activates and opens the path through diode 86, with the remaining DC path now only thru relay 72. If any comparator output grounds the base of transistor 71, relay 72 will be deenergized, and remain in the deenergized state. Relay 72 sends DC power to the secondary preamplifier comparator/preamplifier circuitry and also activates an alarm closure at J4A and J4B, indicating the primary preamplifier has been switched out. Note that all DC power is removed from the primary preamplifier and comparator circuitry when a fault is detected. Diode 87 prevents voltage present at RF coaxial relays 32 and 40 from powering up the primary preamplifier circuits when the backup preamplifier is on line.

Switches 88 and 76 are setup devices used to permanently deactivate relays 82 or 72 respectively.

If a power supply failure occurs and DC power is not available at J1, relay 91 is deenergized and power is supplied from a battery and voltage regulator at the base through J16. Monitoring of the tower mount housing voltage at the base permits the voltage regulator to be adjusted to the proper DC voltage at the tower mount housing.

When the primary preamplifier fails, DC power is supplied to J2 of FIG. 4 from the closed contact set 74 of the de-energized relay 72 of the primary amplifier circuit illustrated in FIG. 3. J2 is the input to the backup power distribution delay circuit of FIG. 4 which provides a B+ source to power the backup voltage comparator circuit. This circuit is controlled by the delay transistor 181 which is turned on when capacitor 183 is charged and its base is positive (0.7 to 1.0 volts). The ratio of resistor 184 to resistors 184+185 is about 13 to 1 so the 15 volt input places 1.9 volts at the base of the delay transistor 181 when capacitor 183 is fully charged through resistor 185. The delay thus set by the RC time constant of capacitor 183 and resistor 184 delays the energization of relay 182 which creates the settling time required by the preamplifier circuits by powering the backup operating voltage circuit until relay 172 energizes. If relay 172 does not energize before relay 182, the backup preamplifier will not come on line.

In the backup preamplifier comparator circuits of FIG. 4, resistors 161 and 162 are in series with the DC power to high level and low noise preamplifier stages, 38 and 37 of FIG. 2, respectively via J10 and J9. The value of these resistors is selected to provide a small voltage which is proportional to current draw of the stages of the backup preamplifier, 14, which in the preferred embodiment is 300 to 350 millivolts.

This voltage is amplified and passed to the respective DC comparator, 155 and 156 or 157 and 158, for either the high level or Low noise preamplifier stage. The DC gain stage, 154 or 153, is adjusted for a DC output of 10 volts to the appropriate comparator. If the normal sample voltage is 350 millivolts, this is a gain of 28.57.

A current draw variance in the sampled preamplifier stage of +/−18% indicates some fault in the amplifier, and the bypass cable 43 is be selected by the RF relay action described with respect to FIG. 2. If 10 volts is the norm to the comparator, a +/−18% change in current draw will translate to 11.8 volts high trip and 8.2 volts low trip. These trip points are set by proper selection of resistors 163, 164 and 165 on the high level comparator and 166, 167 and 168 on the low noise comparator.

An NPN transistor, 171, is used as a switch to control energizing relay 172. The transistor circuit is a grounded emitter configuration so the base voltage of the transistor must be positive relative to the emitter for collector current to flow from the grounded emitter to the collector and up through the coil of relay 172, energizing the relay. If the voltages at the inputs to the comparators, 155, 156, 157 or 158, are within the selected ranges, their the high impedance outputs result in a positive voltage across resistor 173 which turns transistor 171 on. As long as the comparator outputs present a high Impedance to the base of transistor 171, a positive voltage from resistor 173 will turn on the transistor and current will flow from the grounded emitter to the base and up thru resistor 173. Current will also flow from emitter to collector, energizing relay 172.

As long as relay 172 remains energized, the RF coaxial relays 32, 34, 39 and 40 are energized via connectors J3 and J7 and the signal path is through backup preamplifier 14 as a function of the status of RF coaxial relays 34 and 39 of FIG. 2. If any one of the comparators, 155, 156, 157 or 158, switches to a low impedance, that is, essentially ground, it will turn off transistor 172, deenergize relay 172. This causes the normally closed contact set 174 of relay 172 to open and halt the positive DC potential applied to the coils or the RF coaxial relays 32, 34, 39 and 40 illustrated in FIG. 2 via J3 and J7. This causes the bypass cable 43 to replace both the primary and backup preamplifiers in the RF signal channel.

Deenergizing relay 172 allows the normally closed contact set 175 to supply B+ from the ground supply via J4A and contacts 75 of relay 72 to J4C and then to the backup alarm via J4C so an alarm on the backup preamplifier will not occur when the primary preamplifier is in operation. When the primary preamplifier is in operation, there is no DC power sent to the backup preamplifier circuitry to energize relay 172 and open the alarm circuit. Diode 187 prevents the activation of RF coaxial relays 34 and 39 when RF coaxial relays 32 and 40 are activated in the primary mode.

Closing switch 176 will turn off transistor 171 to disable the backup preamplifier as if one of the comparators switched to low impedance.

The backup alarm signals routed thru relay 72 and switches 188 and 176 are "setup devices" to prevent the energizing of relays 182 and 172 respectively.

Figure 5:
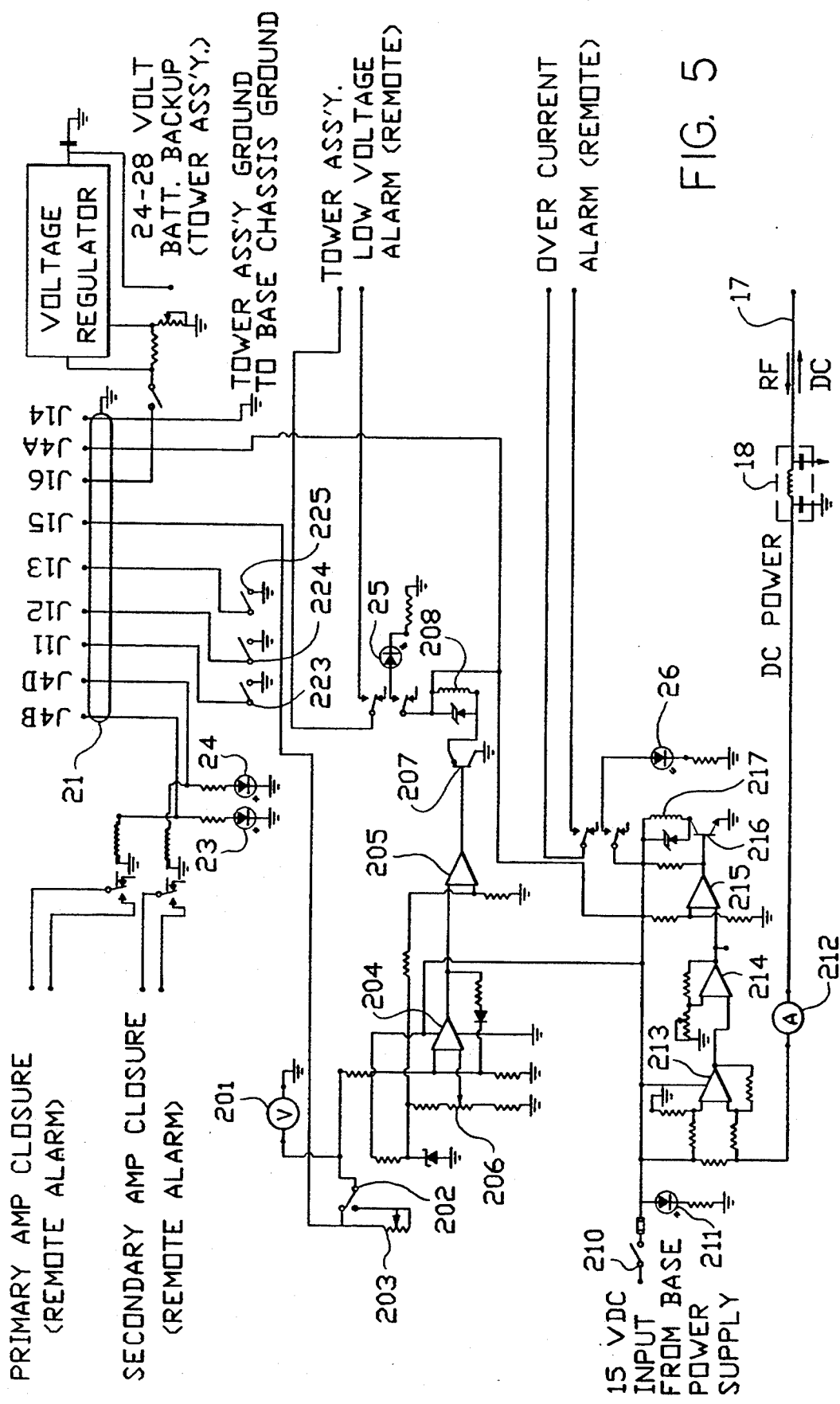
FIG. 5 is a schematic diagram of the base monitor and control panel including the voltage and current alarm system.

The tower mounted systems, 20, are functionally connected to the base unit, the base monitor and control panel 30 of FIG. 1, by a 9-conductor alarm and control cable 21 which transmits indicator and control functions between the two units. The base unit includes the low voltage and high current alarm systems illustrated in FIG. 5.

The low voltage alarm system includes a voltmeter 201 which monitors the DC voltage input to the tower mounted circuitry via connector J15 and switch 202 which connects the voltmeter directly to the tower mounted equipment or to the tower mounted equipment via a potentiometer 203. The potentiometer permits the creation of a simulated low voltage observable on the voltmeter and provides a target voltage for adjustment purposes. The low voltage alarm circuit comprised of a voltage comparator including differential amplifiers 204 and 205 is initially adjusted by setting its operational threshold to the low voltage produced by potentiometer 203 via potentiometer 206.

With the low voltage simulating potentiometer 203 out of the circuit, the low voltage alarm circuit is connected directly to the tower mounted equipment. When the monitored voltage is above the preset minimum, transistor 207 is held on which causes relay 208 to be energized. When a low voltage situation occurs, transistor 207 is switched off and relay 208 is deenergized. This causes LED 25 to illuminate indicating a low voltage at the tower assembly. It also provides a signal to the tower assembly remote low voltage alarm.

Fifteen volts DC is applied from the base power supply through switch 210 through ammeter 212 to the tower mounted system via the tower transmission line 17. An indicator, 211 is provided at the output of switch 210 to signal that power is applied to the tower mounted housing. The current draw on the power supply is measured by a series of three differential amplifiers, 213, 214 and 215 which normally hold transistor 216 in a conducting state. However, when the current exceeds a preset limit, transistor 216 is turned off and relay 217 is deenergized. This causes LED 26 to illuminate providing a high current alarm. This action also causes a circuit connection to a remote over-current alarm indication.

An RF pick-off and bias injector 18 is located in the base unit side of the tower transmission line to provide a means to extract the RF signal to complete the RF channel and provide a means to supply DC power to the tower mount equipment. A similar circuit is located in the tower mounted equipment to allow the RF signal to be injected onto the DC carrying tower transmission line 17.

The alarm and control cable 21 also provides a means to connect LED 23 to the tower via connector J4B. This indicator provides an alarm when the primary preamplifier is switched out of the circuit.

LED 24 is connected to the tower mounted equipment via connector J4D and it provides an indication when both the primary and backup preamplifiers are switched out of the RF signal channel and disconnected from their power source. Both LEDs 23 and 24 may be connected to remote indicators.

Switch 223 provides a remote ground to the delay circuit for the primary preamplifier via connector J11. This ground will cause that circuit to be turned off line, forcing a primary amplifier insertion and disabling secondary amplifier operation as a troubleshooting aid.

Switch 224 is connected to the base of transistor 71 via connector J12 to switch that translator off and deenergize relay 72 of the primary preamplifier circuit in a manner similar to that described for switch 76.

Switch 225 is connected to the backup preamplifier circuit via connector J13. This switch is in parallel with switch 188 and its purpose is to remotely turn off the delay transistor 181 of the backup preamplifier delay circuit in a manner similar to that described for switch 188. Grounding switch 224 and 225 will force secondary amplifier insertion into the system as a troubleshooting aid.

While preferred embodiments of this invention have been illustrated and described, variations and modifications may be apparent to those skilled in the art. Therefore, I do not wish to be limited thereto and ask that the scope and breadth of this invention be determined from the claims which follow rather than the above description.

What is claimed is:

1. An amplifier system, comprising:
   an input transmission line;
   an output transmission line;
   a primary amplifier circuit;
   a backup amplifier circuit;
   a bypass circuit;
   amplifier switching means for mutually exclusively connecting said primary amplifying circuit, said backup amplifying circuit and said bypass circuit between said input transmission line and said output transmission line;
   means for generating a primary failure signal in response to an abnormal current draw of said primary amplifier;
   said amplifier switching means comprising means for automatically disconnecting said primary amplifier from said input transmission line and said output transmission line in response to said primary failure signal;
   said amplifier switching means comprising means for automatically connecting said backup amplifier between said input transmission line and said output transmission line in response to said primary failure signal;
   means for generating a backup failure signal in response to an abnormal current draw of said backup amplifier;
   said amplifier switching means comprising means for automatically disconnecting said backup amplifier from said input transmission line and said output transmission line in response to said backup failure signal; and
   said amplifier switching means comprising means for automatically connecting said bypass circuit between said input transmission line and said output transmission line in response to said backup failure signal.

2. An amplifier system as defined in claim 1, comprising;
   an amplifier system power supply;
   a primary operating voltage comparator circuit;
   a backup operating voltage comparator circuit; and
   an operating voltage switching means responsive to said primary failure signal for mutually exclusively energizing said primary operating voltage comparator circuit and said backup operating voltage comparator circuit with voltage supplied by said amplifier system power supply.

3. An amplifier system as defined in claim 2, wherein:
   said means for generating a primary failure signal generates said signal in response to the current draw of said primary amplifier exceeding a preset upper limit when said primary amplifier is connected between said input transmission line and said output transmission line;

said means for generating said primary failure signal generates said signal in response to the current draw of said primary amplifier exceeding a preset lower limit when said primary amplifier is connected between said input transmission line and said output transmission line;

said means for generating a backup failure signal generates said signal in response to the current draw of said backup amplifier exceeding a preset upper limit when said backup amplifier is connected between said input transmission line and said output transmission line; and said means for generating said backup failure signal generates said signal in response to the current draw of said backup amplifier exceeding a preset lower limit when said backup amplifier is connected between said input transmission line and said output transmission line.

4. An amplifier system as defined in claim 2, comprising:
a primary power distribution delay circuit for energizing said primary operating voltage comparator circuit for a predetermined period of time upon initial activation of said amplifier system with voltage supplied by said amplifier system power supply.

5. An amplifier system as defined in claim 4, comprising:
a backup power distribution delay circuit for energizing said backup operating voltage comparator circuit for a predetermined period of time upon activation by voltage supplied in parallel to said backup operating voltage comparator circuit by said operating voltage switching means.

6. An amplifier as defined in claim 2 wherein said primary amplifier circuit, said backup amplifier circuit, said bypass circuit, said amplifier switching means, said means for generating a primary failure signal, said means for generating a backup failure signal, said primary operating voltage comparator circuit, said backup operating voltage comparator circuit, and said operating voltage switching means are contained in a tower mounted housing and said amplifier system power supply is located at the base of a tower supporting said tower mounted housing.

7. An amplifier system as defined in claim 6, comprising:
a tower transmission line for conducting DC power from said amplifier system power supply to said primary operating voltage comparator circuit.

8. An amplifier system as defined in claim 7, comprising:
a voltage comparator electrically connected to compare the voltage level of said tower transmission line supplied DC power at said tower mounted housing to said operating voltage switching means with a preset voltage level;
a low voltage switching means driven by said voltage comparator;
said low voltage switching means configured to change state in response to an output signal from said voltage comparator indicative of said voltage level supplied to said operating voltage switching means by said tower transmission line falling below said preset level; and
an alarm circuit activated by said change of state of said low voltage switching means.

9. An amplifier system as defined in claim 7, comprising:
a current monitor circuit electrically connected to monitor current flow through said tower transmission line;
a high current alarm switching means driven by said current monitor circuit;
said high current alarm switching means configured to change state in response to an output signal from said current monitor circuit indicative of said monitored current exceeding a preset level; and
a high current alarm circuit activated by said change of state of said high current alarm switching means.

10. An amplifier system as defined in claim 7, comprising:
a battery power source; and
means for substituting said battery power source for said tower transmission line supplied DC power.

11. An amplifier system, comprising:
an input transmission line;
an output transmission line;
a primary amplifier circuit;
a backup amplifier circuit;
a bypass circuit;
an amplifier system power supply;
amplifier switching means for mutually exclusively connecting said primary amplifying circuit, said backup amplifying circuit and said bypass circuit between said input transmission line and said output transmission line;
means for generating a primary failure signal in response to the current draw of said primary amplifier exceeding a preset upper limit or a preset lower limit when said primary amplifier is connected between said input transmission line and said output transmission line;
a primary operating voltage comparator circuit for supplying operating voltage to said primary amplifier circuit and said means for generating a primary failure signal;
said amplifier switching means comprising means for disconnecting said primary amplifier from said input transmission line and said output transmission line in response to said primary failure signal;
said amplifier switching means comprising means for connecting said backup amplifier between said input transmission line and said output transmission line in response to said primary failure signal;
means for generating a backup failure signal in response to the current draw of said backup amplifier exceeding a preset upper limit or a preset lower limit when said backup amplifier is connected between said input transmission line and said output transmission line;
a backup operating voltage comparator circuit for supplying operating voltage to said backup amplifier circuit and said means for generating a backup failure signal;
an operating voltage switching means for deenergizing said primary operating voltage comparator circuit and energizing said backup operating voltage comparator circuit in response to said primary failure signal;
said amplifier switching means comprising means for disconnecting said backup amplifier from said input transmission line and said output transmission line in response to said backup failure signal; and said amplifier switching means comprising means for connecting said bypass circuit between said input transmission line and said output transmission line in response to said backup failure signal.

12. An amplifier system as defined in claim 11, comprising:
a primary power distribution delay circuit for energizing said primary operating voltage comparator circuit for a predetermined period of time upon initial activation of said amplifier system with voltage supplied by said amplifier system power supply.

13. An amplifier system as defined in claim 12, comprising:
a backup power distribution delay circuit for energizing said backup operating voltage comparator circuit for a predetermined period of time upon activation by voltage supplied in parallel to said backup operating voltage comparator circuit by said operating voltage switching means.

14. An amplifier as defined in claim 13 wherein said primary amplifier circuit, said backup amplifier circuit, said bypass circuit, said amplifier switching means, said means for generating a primary failure signal, said means for generating a backup failure signal, said primary operating voltage comparator circuit, said backup operating voltage comparator circuit, and said operating voltage switching means are contained in a tower mounted housing and said amplifier system power supply is located at the base of a tower supporting said tower mounted housing.

15. An amplifier system as defined in claim 14, comprising:
a tower transmission line for conducting DC power from said amplifier system power supply to said primary operating voltage comparator circuit.

16. An amplifier system as defined in claim 15, comprising:
a voltage comparator electrically connected to compare the voltage level of said tower transmission line supplied DC power at said tower mounted housing to said operating voltage switching means with a preset voltage level;
a low voltage switching means driven by said voltage comparator;
said low voltage switching means configured to change state in response to an output signal from said voltage comparator indicative of said voltage level supplied to said operating voltage switching means by said tower transmission line voltage at said tower mounted housing falling below said preset level; and
an alarm circuit activated by said change of state of said low voltage switching means.

17. An amplifier system as defined in claim 16, comprising:
a current monitor circuit electrically connected to monitor current flow through said tower transmission line;
a high current alarm switching means driven by said current monitor circuit;
said high current alarm switching means configured to change state in response to an output signal from said current monitor circuit indicative of said monitored current exceeding a preset level; and
a high current alarm circuit activated by said change of state of said high current alarm switching means.

18. An amplifier system as defined in claim 17, comprising:
a battery power source located at the base of said tower; and
means for substituting said battery power source for said tower transmission line supplied DC power.

19. A preamplifier system, comprising:
an input transmission line;
an output transmission line;
a primary preamplifier circuit;
a backup preamplifier circuit;
a bypass circuit;
a preamplifier system power supply;
preamplifier switching means for mutually exclusively connecting said primary amplifying circuit, said backup amplifying circuit and said bypass circuit between said input transmission line and said output transmission line;
means for generating a primary failure signal in response to the current draw of said primary preamplifier exceeding a preset upper limit or a preset lower limit when said primary preamplifier is connected between said input transmission line and said output transmission line;
a primary operating voltage comparator circuit for supplying operating voltage to said primary preamplifier circuit and said means for generating a primary failure signal;
a primary power distribution delay circuit for energizing said primary operating voltage comparator circuit for a predetermined period of time upon initial activation of said preamplifier system with voltage supplied by said preamplifier system power supply;
said preamplifier switching means comprising means for disconnecting said primary preamplifier from said input transmission line and said output transmission line in response to said primary failure signal;
said preamplifier switching means comprising means for connecting said backup preamplifier between said input transmission line and said output transmission line in response to said primary failure signal;
means for generating a backup failure signal in response to the current draw of said backup preamplifier exceeding a preset upper limit or a preset lower limit when said backup preamplifier is connected between said input transmission line and said output transmission line;
a backup operating voltage comparator circuit for supplying operating voltage to said backup preamplifier circuit and said means for generating a backup failure signal;
an operating voltage switching means for deenergizing said primary operating voltage comparator circuit and energizing said backup operating voltage comparator circuit in response to said primary failure signal;
a backup power distribution delay circuit for energizing said backup operating voltage comparator circuit for a predetermined period of time upon activation by voltage supplied in parallel to said backup operating voltage comparator circuit by said operating voltage switching means;
said preamplifier switching means comprising means for disconnecting said backup preamplifier from said input transmission line and said output transmission line in response to said backup failure signal; and said preamplifier switching means comprising means for connecting said bypass circuit between said input transmission line and said output transmission line in response to said backup failure signal.

20. A preamplifier as defined in claim 19 wherein said primary preamplifier circuit, said backup preamplifier circuit, said bypass circuit, said preamplifier switching means, said means for generating a primary failure signal, said means for generating a backup failure signal, said primary operating voltage comparator circuit, said backup operating voltage comparator circuit, and said operating voltage switching means are contained in a tower mounted housing and said preamplifier system power supply is located at the base of a tower supporting said tower mounted housing, comprising:

a tower transmission line for conducting DC power from said preamplifier system power supply to said primary operating voltage comparator circuit;

a voltage comparator electrically connected to compare the voltage level of said tower transmission line supplied DC power at said tower mounted housing to said operating voltage switching means with a preset voltage level;

a low voltage switching means driven by said voltage comparator;

said low voltage switching means configured to change state in response to an output signal from said voltage comparator indicative of said voltage level supplied to said operating voltage switching means by said tower transmission line voltage at said tower mounted housing falling below said preset level;

an alarm circuit activated by said change of state of said low voltage switching means;

a current monitor circuit electrically connected to monitor current flow through said tower transmission line;

a high current alarm switching means driven by said current monitor circuit;

said high current alarm switching means configured to change state in response to an output signal from said current monitor circuit indicative of said monitored current exceeding a preset level;

a high current alarm circuit activated by said change of state of said high current alarm switching means;

a battery power source located at the base of said tower; and means for substituting said battery power source for said tower transmission line supplied DC power.

* * * * *